United States Patent
Chen et al.

(10) Patent No.: US 8,440,552 B1
(45) Date of Patent: May 14, 2013

(54) METHOD TO FORM LOW SERIES RESISTANCE TRANSISTOR DEVICES ON SILICON ON INSULATOR LAYER

(75) Inventors: Kangguo Chen, Schenectady, NY (US); Bruce B. Doris, Brewster, NY (US); Balasubramanian S. Haran, Watervliet, NY (US); Amlan Majumdar, White Plains, NY (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/346,008

(22) Filed: Jan. 9, 2012

(51) Int. Cl.
*H01L 21/225* (2006.01)

(52) U.S. Cl.
USPC ............ 438/563; 438/E21.144; 438/E21.279; 257/623

(58) Field of Classification Search .................. 257/327, 257/335, 336, 340, 344, 347, 352, 353, 618, 257/623, E21.377, E21.14, E21.141, E21.144, 257/E21.15, E21.275, E21.279; 438/149, 438/151, 163, 222, 300, 542, 550, 558, 561, 438/563, 164, 412, 479, 517
See application file for complete search history.

(56) References Cited

U.S. PATENT DOCUMENTS

| | | | |
|---|---|---|---|
| 5,698,881 A | 12/1997 | Yoshitomi et al. | |
| 5,977,561 A | 11/1999 | Wu | |
| 5,994,209 A | 11/1999 | Yieh et al. | |
| 6,255,152 B1 | 7/2001 | Chen | |
| 6,346,447 B1 * | 2/2002 | Rodder | 438/300 |
| 6,774,000 B2 | 8/2004 | Natzle et al. | |
| 6,989,322 B2 | 1/2006 | Gluschenkov et al. | |
| 7,176,481 B2 | 2/2007 | Chen et al. | |
| 2009/0289305 A1 | 11/2009 | Majumdar | |

OTHER PUBLICATIONS

Lei et al., "Low-Temperature Growth of Silicon-Boron Layer as Solid Diffusion Source for Polysilicon Contact p+ -n. Shallow Junction", IEEE Transactions on Electron Devices, vol. 42, Issue 12, 1995, pp. 2104-2110.
Majumdar et al., "High-Performance Undoped-Body 8-nm-Thin SOI-Field-Effect Transistors", IEEE Electron Device Letters, vol. 29, Issue 5, May 2008, pp. 515-517.
Majumdar et al., "Gate Length and Performance Scaling of Undoped-Body Extremely Thin SOI MOSFETs", IEEE Electron Device Letters, vol. 30, issue 4, Apr. 2009, pp. 413-415.

(Continued)

*Primary Examiner* — Eduardo A Rodela
(74) *Attorney, Agent, or Firm* — Harrington & Smith

(57) ABSTRACT

A method includes providing an ETSOI wafer having a semiconductor layer having a top surface with at least one gate structure having on sidewalls thereof a layer of dielectric material. A portion of the layer of dielectric material extends away from the gate structure on the surface of the semiconductor layer. The method further includes faulting a raised S/D on the semiconductor layer adjacent to the portion of the layer of dielectric material, removing the portion of the layer of dielectric material to expose an underlying portion of the surface of the semiconductor layer and applying a layer of glass containing a dopant to cover at least the exposed portion of the surface of the semiconductor layer. The method further includes diffusing the dopant through the exposed portion of the surface of the semiconductor layer to form a source extension region and a drain extension region.

18 Claims, 13 Drawing Sheets

OTHER PUBLICATIONS

Cheng et al., "Extremely Thin SOI (ETSOI) CMOS with Record Low Variability for Low Power System-on-Chip Applications", 2009 IEEE International Electron Devices Metting (IEDM), Dec. 7-9, 2009 4 pages.

Khakifirooz et al., "High-Performance Partially Depleted SOI PFETs with In Situ Doped SiGe Raised Source/Drain and Implant-Free Extension", IEEE Electron Device Letters, vol. 31, Issue 3, 2011, pp. 267-269.

Uchino et al., A Raised Source/Drain Technology Using In-Situ P-Doped SiGe and B-doped Si for 0.1-um CMOS ULSIs, Electron Devices meeting, 1998, IEDM '97, Technical Digest, International, Dec. 7-10, 1997, pp. 479-482.

Nguyen Nhu—"Spin-on glass materials and applications in advanced IC technologies" 1999—Universiteit van Amsterdam. Prof. dr. A.F. Willoughby. University of Southampton.

* cited by examiner

METHOD TO FORM LOW SERIES RESISTANCE TRANSISTOR DEVICES ON SILICON ON INSULATOR LAYER

TECHNICAL FIELD

The exemplary embodiments of this invention relate generally to semiconductor devices and fabrication techniques and, more specifically, relate to the fabrication of semiconductor transistor devices, such as field effect transistors (FETs) used in random access memory (RAM) and logic circuitry, using an extremely thin silicon on insulator (ET-SOI) substrate, also referred to as a fully-depleted silicon on insulator (FDSOI) substrate.

BACKGROUND

ETSOI is a leading candidate for continuous scaling of planar Si technology. One consideration to improve performance and reduce series resistance in ETSOI is the use of raised source drain (RSD) epitaxy.

For Poly-SiON gates it has been demonstrated that using an extension-last integration scheme, where extension implants are activated with a diffusion-less laser anneal, reduces the series resistance penalty. Reference in this regard can be made to, for example, A. Majumdar et al., Elec. Dev. Lett. V29 (5), 515-517, 2008.

SUMMARY

In a first aspect thereof the exemplary embodiments of this invention provide a method to fabricate a transistor. The method includes providing a wafer comprising a substrate, an insulating layer disposed over the substrate and semiconductor layer disposed over the insulating layer. The wafer is provided with at least one gate structure comprising on sidewalls thereof a layer of dielectric material, where a portion of the layer of dielectric material extends away from the gate structure and is disposed on a surface of the semiconductor layer. The method further includes forming a raised source and a raised drain on the semiconductor layer adjacent to the portion of the layer of dielectric material, removing the portion of the layer of dielectric material to expose an underlying portion of the surface of the semiconductor layer between the gate structure and the raised source and the raised drain, and applying a layer of material comprised of a glass containing a dopant. The layer of material is applied so as to cover at least the exposed portion of the surface of the semiconductor layer. The method further includes diffusing the dopant from the layer of material through the exposed portion of the surface of the semiconductor layer to form a source extension region and a drain extension region and removing the layer of material.

In a second aspect thereof the exemplary embodiments of this invention provide a method to fabricate a plurality of transistors. The method includes providing a wafer comprising a substrate, an insulating layer disposed over the substrate and semiconductor layer disposed over the insulating layer. The wafer is provided with at least a first gate structure and a second gate structure each comprising on sidewalls thereof a layer of dielectric material. A portion of the layer of dielectric material extends away from each gate structure and is disposed on a surface of the semiconductor layer. The method further includes forming a raised source and a raised drain on the semiconductor layer adjacent to the portion of the layer of dielectric material of each gate structure and removing the portion of the layer of dielectric material to expose an underlying portion of the surface of the semiconductor layer between each gate structure and the raised source and the raised drain. The method further includes applying a first layer of glass containing a first type of dopant, where the first layer of glass is applied so as to cover at least the exposed portion of the surface of the semiconductor layer adjacent to the first gate structure. The method further includes applying a second layer of glass containing a second type of dopant, where the second layer of glass is applied so as to cover at least the exposed portion of the surface of the semiconductor layer adjacent to the second gate structure. The method further includes annealing the first layer of glass and the second layer of glass to diffuse the first dopant from the first layer or glass and second dopant from second layer of glass through the underlying exposed portions of the surface of the semiconductor layer to form adjacent to the first gate structure and the second gate structure a source extension region and a drain extension region. The method further includes removing the first and second layers of glass.

In another aspect thereof the exemplary embodiments of this invention provide transistor structure that comprises a channel located in an extremely thin silicon on insulator (ETSOI) layer that is disposed between a raised source and a raised drain; and a gate structure comprising a gate conductor disposed over the channel and between the source and the drain and a gate spacer layer disposed over the gate conductor. In the transistor structure the raised source and the raised drain each have a facet that is upwardly sloping away from the gate structure and a lower portion of the source and a lower portion of the drain are separated from the channel by an extension region containing a dopant species diffused from a dopant-containing glass.

BRIEF DESCRIPTION OF THE SEVERAL VIEWS OF THE DRAWINGS

FIG. 1 shows an enlarged cross-sectional view of a portion of an ETSOI starting structure;

FIG. 2 shows the structure of FIG. 1 after growth of RSD structures and the removal of a sacrificial spacer from gate stack sidewalls;

FIG. 3 shows the structure of FIG. 2 after a thin spacer layer is selectively removed from horizontal surfaces, resulting in exposing an underlying surface of an ETSOI layer;

FIG. 4 shows the structure of FIG. 3 after doped glass layers are selectively applied to NMOS and PMOS devices;

FIG. 5 shows the structure of FIG. 4 after an anneal is performed to drive dopants from the doped glass layers into the ETSOI layer to form Arsenic (or Phosphorus) doped extensions and Boron doped extensions for nFET and pFET devices, respectively; and FIG. 6 shows the structure of FIG. 5 after an etch to remove the doped glass layers enabling conventional CMOS processing to continue.

FIG. 7 shows an enlarged cross-sectional view of a portion of the ETSOI starting structure as in FIG. 1, where a gate structure at this point includes a dummy gate plug;

FIG. 8 shows the structure of FIG. 7 after growth of RSD structures and the removal of a sacrificial spacer from gate structure sidewalls;

FIG. 9 shows the structure of FIG. 8 after removal of a thin TEOS oxide spacer from the gate structure;

FIG. 10 shows the structure of FIG. 9 after doped glass layers are selectively applied to NMOS and PMOS devices;

FIG. 11 shows the structure of FIG. 10 after an anneal is performed to drive dopants from the doped glass layers into the ETSOI layer to form Arsenic doped extensions and Boron doped extensions for nFET and pFET devices, respectively; and FIG. 12 shows the structure of FIG. 11 after an etch to remove the doped glass layers enabling conventional CMOS processing, including replacement gate processing, to continue.

DETAILED DESCRIPTION

Figure 13:
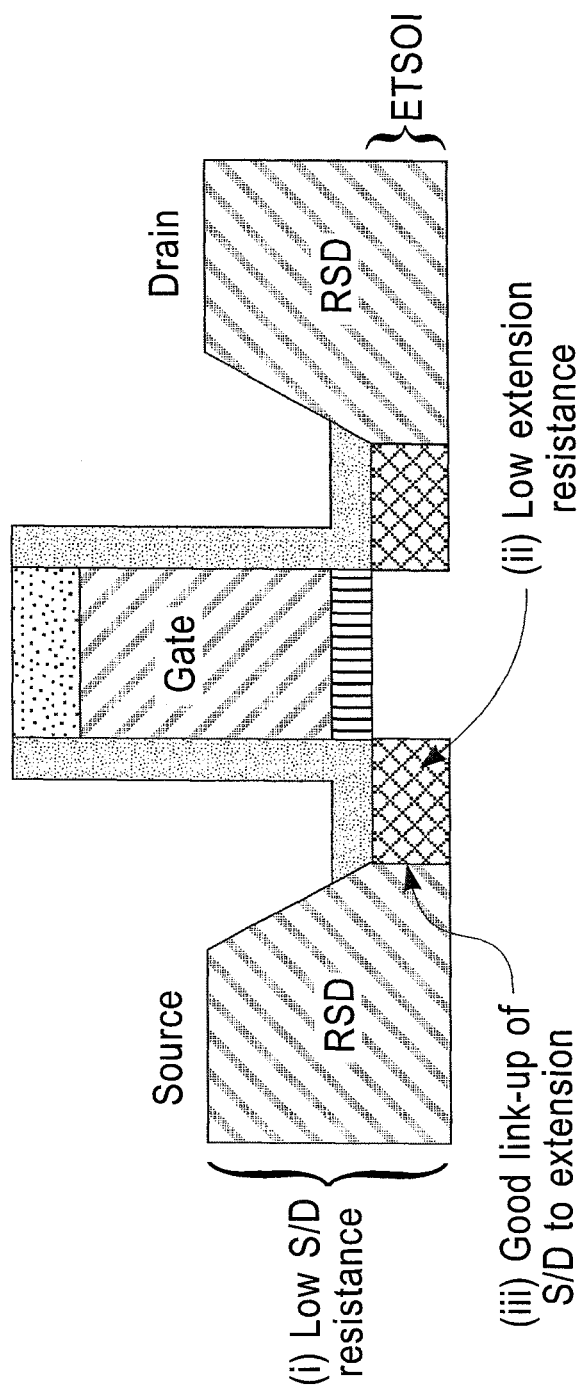
FIG. 13 shows an ETSOI device and is useful in explaining the desirable goals of providing low Source/Drain (S/D) resistance; low extension resistance; and a good link-up (interface) between the S/Ds and the extensions.

As is depicted in FIG. 13 a desirable junction design for an ETSOI device with RSD involves: (i) low Source/Drain (S/D) resistance; (ii) low extension resistance; and (iii) a good link-up (interface) between the S/D and the extension.

The conventional implant approach for doping thin Si in the transistor extension region leads to SOI amorphization, and subsequent thermal processing is not effective to anneal the resulting defects in the SOI layer. Further, device designs for Gate Lengths ($L_g$)≦20 nm geometries and smaller require the use of diffusion-less anneals or low temperature processing which limit the maximum temperature that can be used. The presence of the resulting defects and impurities have been shown to degrade the carrier mobility in ETSOI devices. The exemplary embodiments of this invention provide an implant damage free, extension last integration scheme that overcomes these problems.

The exemplary embodiments of this invention employ doped glass as a dopant diffusion source for doping transistor device extension regions of ETSOI-based devices. For example, Arsenic (As) or Phosphorus (P) doped silicate glass can be used for nMOS transistor devices and Boron (B) doped silicate glass can be used for pMOS transistor devices. The extension is doped after RSD processing. The RSD processing can be performed with doped epitaxial (epi) Si growth (in situ doped RSD) or with undoped epi Si growth, which is then subsequently doped by being implanted. In both cases the S/D is activated with a high temperature anneal which reduces the series resistance of the RSD.

Subsequent to the RSD activation a spacer etch is performed to remove a thin spacer layer at the bottom of the RSD between the RSD and a gate structure. This exposes a surface of the ETSOI that will define the extension region within the ETSOI. Doped glass with the appropriate polarity is then deposited alternately on pMOS and nMOS using a hard mask based approach to protect the alternate polarity devices. The dopant is diffused from the doped glass into the underlying extension region. Subsequent to the dopant diffusion the doped glass is removed, such as by a wet etch process, and the junctions are activated with a low temperature and/or laser anneal.

The novel process flow can be implemented for both gate-first and gate-last fabrication techniques, and examples of each are disclosed below. One exemplary advantage of the gate-last processing includes placing the dopants closely adjacent to the gate which reduces the resistance and improves device performance significantly.

The exemplary embodiments provide an integration flow that enables:

(1) an implant-free extension formation;

(2) the use of solid phase dopants for forming the extension; and (3) gate-first or gate-last integration techniques.

FIGS. 1-6 illustrate a gate-first processing embodiment of this invention.

Figure 1:
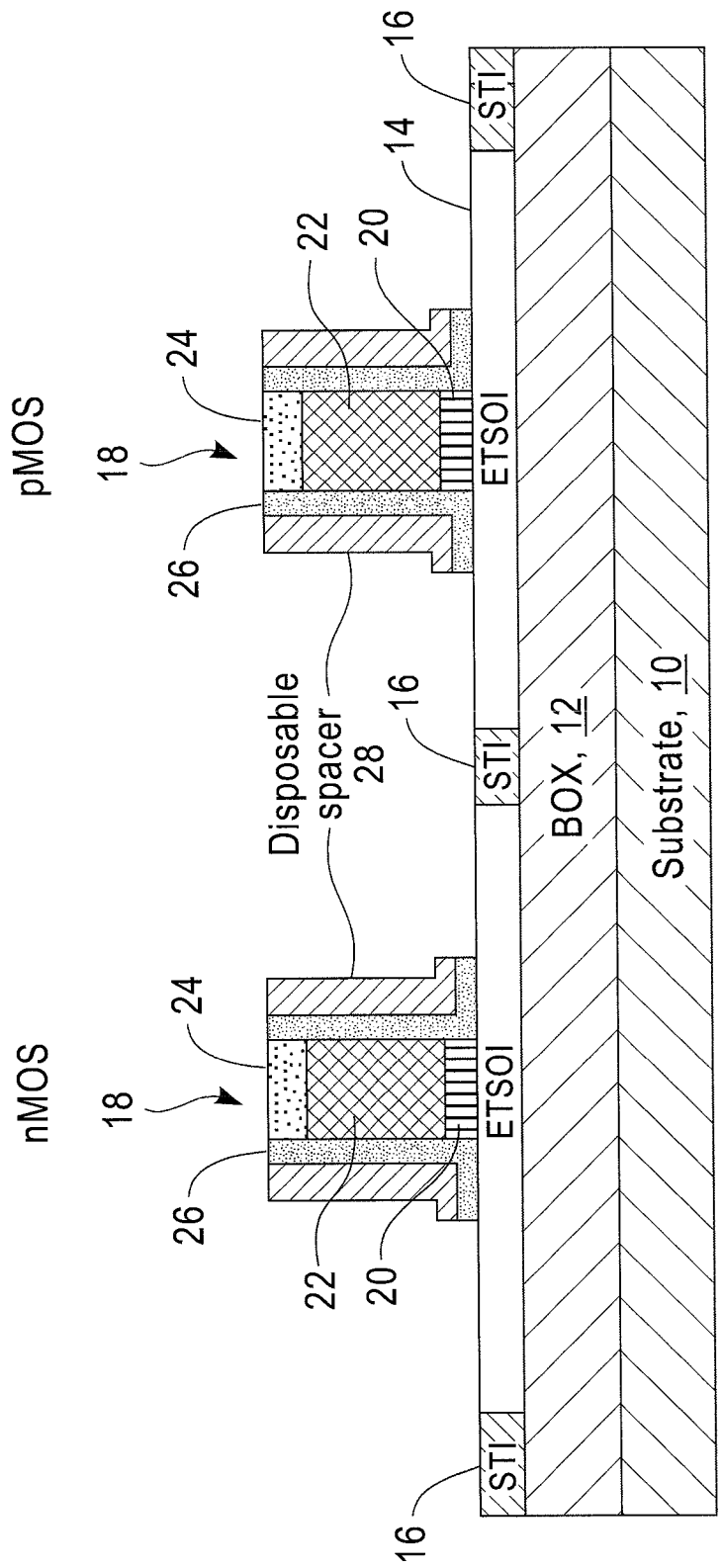
FIGS. 1-6 illustrate a gate-first processing embodiment of this invention, where

FIG. 1 is an enlarged cross-sectional view of a portion of an ETSOI starting structure that includes a substrate 10, an overlying insulting layer (a buried oxide or BOX layer 12) and a Si layer overlying the BOX 12. In FIG. 1, and the other FIGURES, the layer thicknesses are not drawn to scale. The Si layer is preferable an ETSOI layer 14. The BOX 12 can have a thickness in a range of, by example, about 10 nm to about 200 nm. The ETSOI layer 14 can have a thickness in a range of about 5 nm to about 12 nm, with about 6 nm-7 nm being a suitable thickness for many applications of interest. The substrate 10, which is not electrically active, can be formed of any desired material such as silicon or glass and can have any desired thickness.

For convenience two transistor devices are illustrated, with the left device being an nMOS device and the right device being a pMOS device. In practice there will typically be a large number of both types of devices present on the ETSOI starting structure. The nMOS and pMOS devices are separated by regions of shallow trench isolation (STI) 16 that serve to partition the ETSOI layer 14 into active Si islands.

In this gate-first embodiment it is assumed that gate stacks 18 have been fabricated and are present on the ETSOI layer 14. Each gate stack 18 includes, for example, a thin gate dielectric layer 20, an overlying gate conductor 22, a nitride gate cap 24 and a gate insulating spacer 26. The gate conductor can be doped polysilicon (poly) or any metal or metal system having a desired work function (WF). As examples, a metal system can be one or more of TiN, TiC, TaN, TaC, TaSiN, HfN, W, Al and Ru selected at least in part based on the desired work function (WF) of the device (nFET or pFET), as is known. The gate insulating spacer 26 can be formed, by example, of a 30 Å thick layer of plasma enhanced chemical vapor deposition using (PECVD) thermal, or plasma enhanced atomic layer deposition (PEALD), SiN, SiCN, SiBCN, BN, etc. Over the gate insulating spacer 26 is formed a disposable (sacrificial) spacer layer 28 having a thickness of, for example, about 50 Å to about 500 Å The disposable spacer layer 28 can be formed, for example, by PECVD or Atomic Layer Deposition (ALD) either as Oxide only or combined as Oxide and Nitride. The spacer formation is followed by a spacer etch (e.g., a dry plasma etch). The spacer 28 etch, and the etch of the underlying gate insulating spacer 26, is performed so as to leave a portion extending horizontally over the ETSOI layer 14 by an amount that will define an extent of the subsequently diffused extension region as described below.

Figure 2:
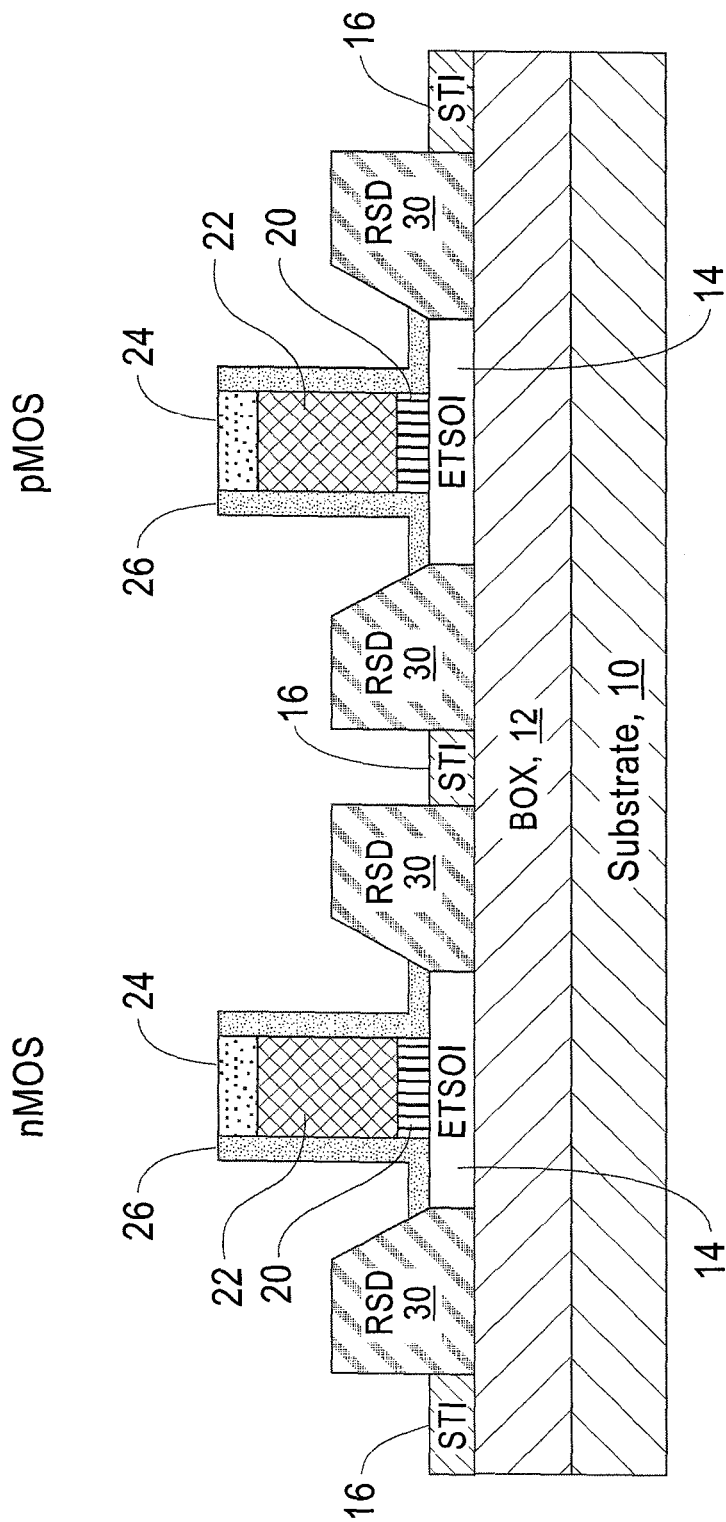

FIG. 2 shows the structure of FIG. 1 after growth of RSD structures 30 and the removal of the sacrificial spacer 28. As non-limiting examples, the RSD structures 30 can be formed by epitaxial growth, e.g., in situ Boron doped (ISBD) SiGe for pMOS and in situ Phosphorus doped (ISP) Si/SiC for nMOS or undoped Si/SiGe. The presence of the spacer 28 shown in FIG. 1 inhibits the epitaxial growth of SiGe or Si/SiGe or Si/C, which is selective to Si, resulting in the formation of the sloping faceted sidewall of each of the RSD structures 30. A wet cleaning etch can be performed prior to growth of the RSD structures 30. After the epi growth of the RSD structures 30 another etch, such as one based on HFI, is performed to remove the spacer 28 resulting in the intermediate structure shown in FIG. 2.

The RSD structures 30 may have a dopant atom concentration in a range of, for example, about $5 \times 10^{20}/cm^3$ to about $8 \times 10^{21}/cm^3$. As a non-limiting example, the RSD structures 30 can be formed by the epitaxial growth of silicon, such as by the use of a mixture of silane and dichlorosilane gases with a chemical vapor deposition (CVD) process. Phosphorus is one suitable n-type dopant, and Boron is one suitable p-type dopant. The epitaxial growth is preferential to Si and results in the formation of the faceted sidewall.

The formation of in-situ doped RSD structures is well characterized in the art. For example, reference can be made to commonly owned U.S. Pat. No. 6,774,000, "Method of Manufacture of MOSFET Device with In-Situ Doped Raised Source and Drain Structures", Wesley C. Natzle et al., and to "A raised source/drain technology using in-situ P-doped SiGe and B-doped Si for 0.1-1 μm CMOS ULSIs", Takashi Uchino et al., Electron Devices meeting, 1997, IEDM '97. Technical Digest, International, 7-10 Dec. 1997, pgs. 479-482. Reference can also be made to "Extremely Thin SOI (ETSOI) CMOS with Record Low Variability for Low Power System-on-Chip Applications", K. Cheng, A. Khakifirooz, P. Kulkarni, S. Ponoth, J. Kuss, D. Shahrjerdi, L. F. Edge, A. Kimball, S. Kanakasabapathy, K. Xiu, S. Schmitz, A. Reznicek, T. Adam, H. He, N. Loubet, S. Holmes, S. Mehta, D. Yang, A. Upham, S.-C. Seo, J. L. Herman, R. Johnson, Y. Zhu, P. Jamison, B. S. Haran, Z. Zhu, L. H. Vanamurth, S. Fan, D. Horak, H. Bu, P. J. Oldiges, D. K. Sadana, P. Kozlowski, D. McHerron, J. O'Neill, B. Doris, Solid-State Circuits Conference Digest of Technical Papers (ISSCC), 2010 IEEE International Issue Date: 7-11 Feb. 2010 pgs. 152-153.

After the RSD structures 30 are formed, either by in-situ doping or by a subsequent dopant implant, and anneal is performed to activate the dopants. The anneal can be a rapid thermal anneal (RTE) conducted at a temperature in a range of about 800° C. to about 1000° C. or higher.

Figure 3:
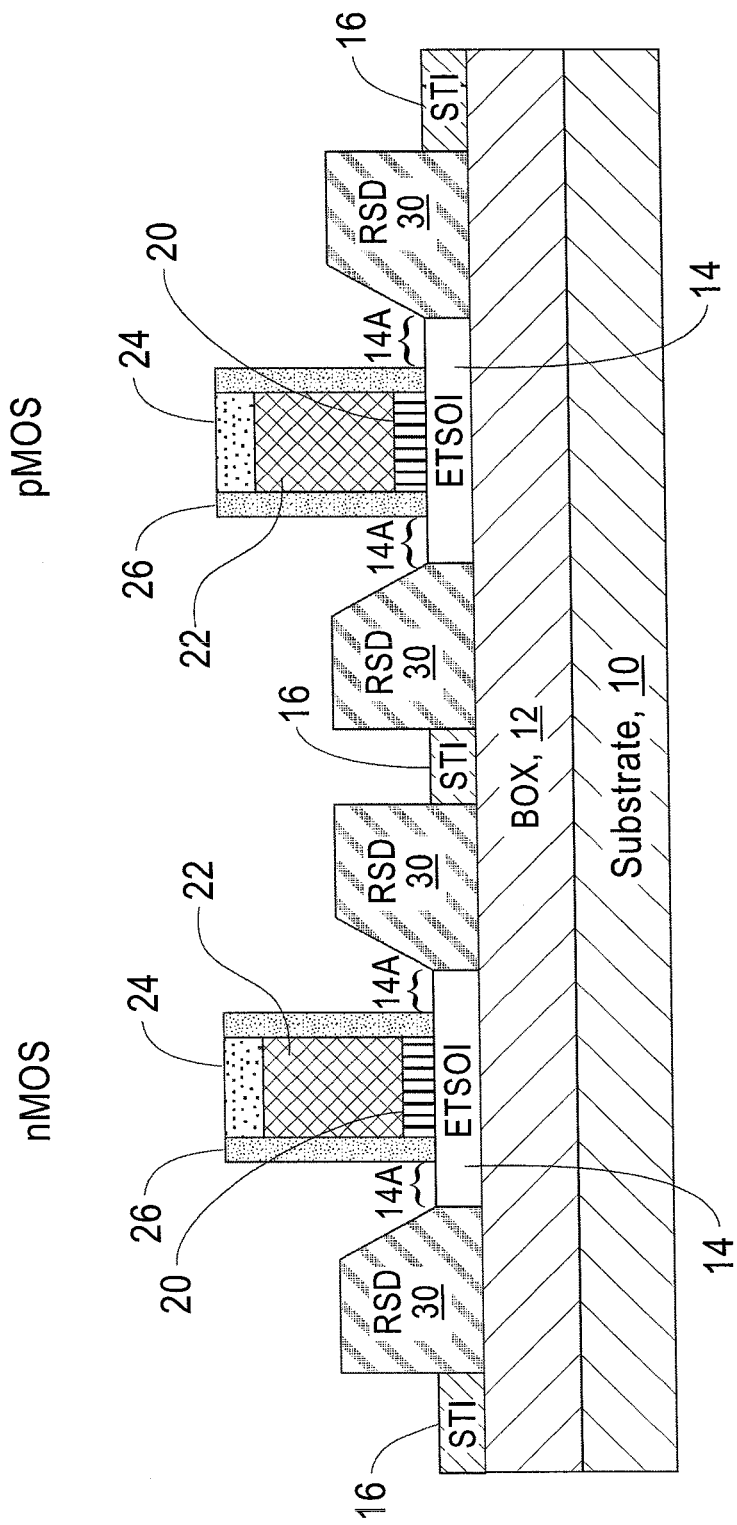

FIG. 3 shows the structure of FIG. 2 after the thin spacer 26 is selectively removed from horizontal surfaces, resulting in exposing the underlying surface 14A of the ETSOI layer 14 adjacent to the gates stacks 18. A dry reactive ion etch (RIE) process is one suitable technique to remove the material of the spacer 26 from the surface of the ETSOI layer 14. The exposed portion 14A can have an extent in a range of about 5 nm to about 25 nm, with about 5 nm to about 7 nm being one suitable extent. The dimensions of the exposed portion 14A of the ETSOI layer 14 will define the dimensions of the extension region formed in FIG. 5.

Figure 4:
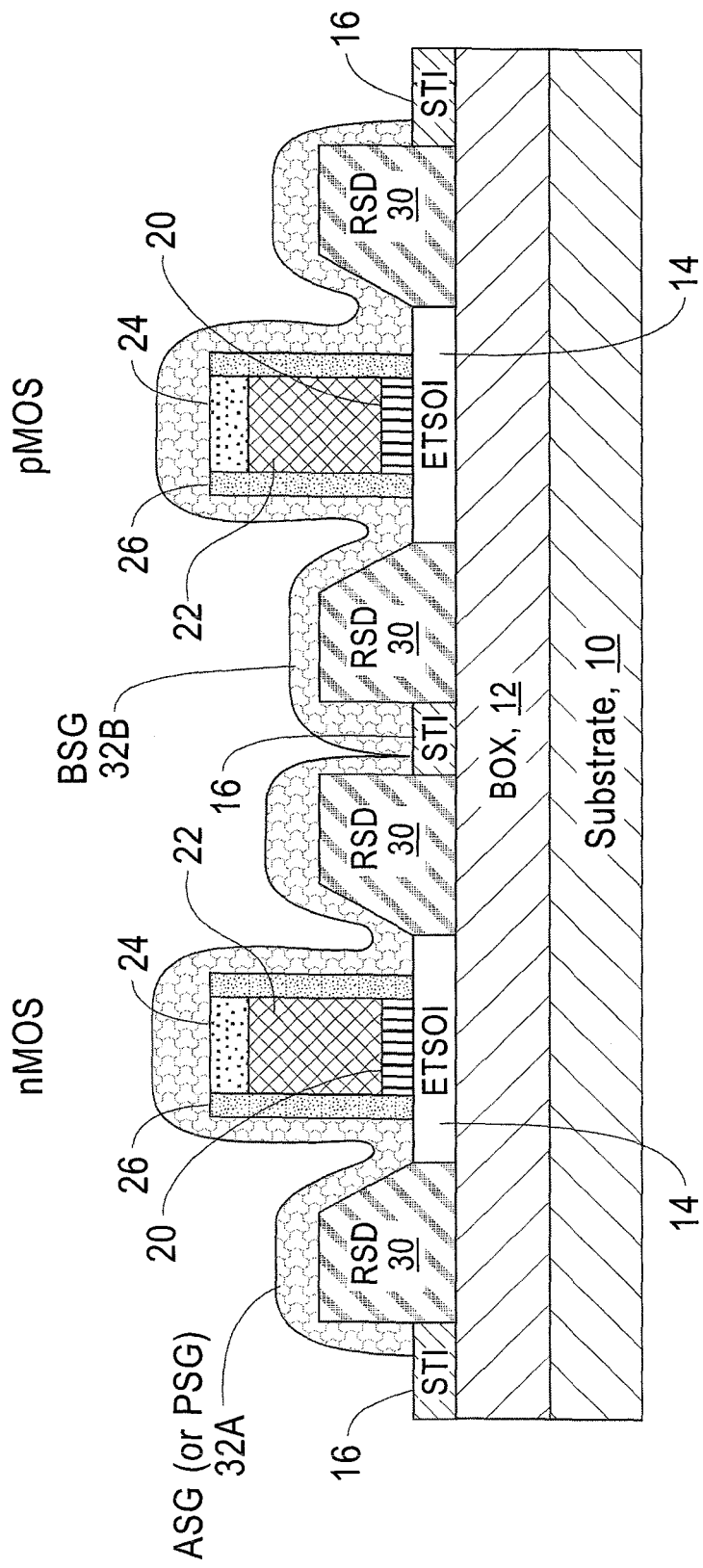

FIG. 4 shows the structure of FIG. 3 after doped glass layers are applied. For nMOS the doped glass layer can, for example, be a layer 32A of arsenic-doped silicate glass (ASG) or phosphorus-doped silicate glass (PSG), while for the pMOS the doped glass layer can be a layer 32B of boron-doped silicate glass (BSG). The doped glass layers 32A, 32B can be applied by a spin-coating or by a chemical vapor deposition (CVD) process as two non-limiting examples. The thickness of the doped glass layers 32A, 32B can be in a range of about 5 nm to about 100 nm. The doped glass layers 32A, 32B can be applied sequentially, such as by first masking the pMOS and depositing the layer 32A over the NMOS, and then masking the NMOS and depositing the layer 32B (or vice versa). Note that the doped glass layers 32A, 32B cover the exposed portions 14A of the ETSOI layer 14. The doped glass layers 32A, 32B serve as dopant diffusion sources during the anneal process described with relation to FIG. 5.

Figure 5:
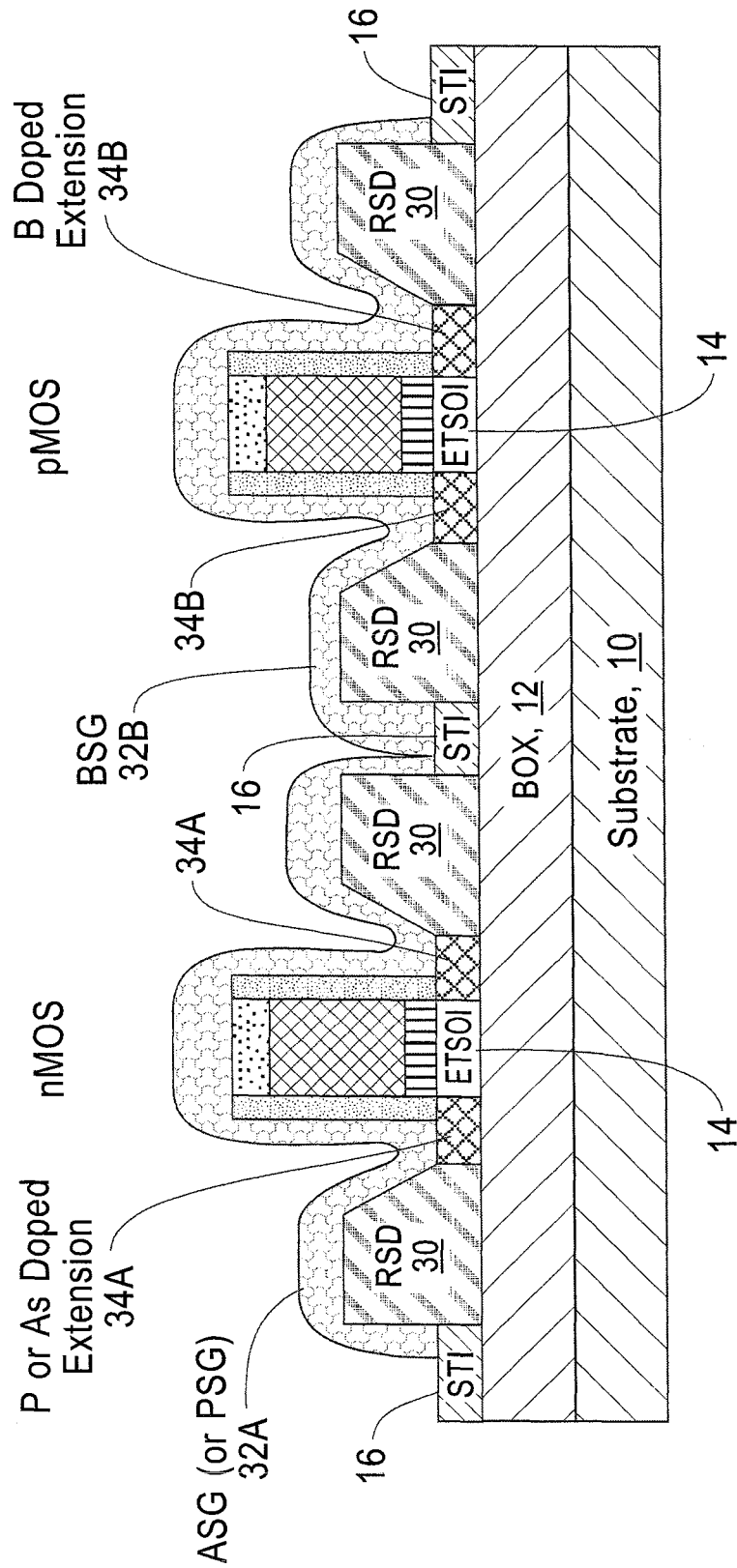

FIG. 5 shows the structure of FIG. 4 after an anneal is performed to drive dopants (e.g., Arsenic in ASG layer 32A and Boron in BSG layer 34B) into the ETSOI layer 14 to form Arsenic (or Phosphorus) doped extensions 34A and Boron doped extensions 34B for nFET and pFET devices, respectively. The anneal process can be performed at a temperature in a range of about, for example, 900° C. to about 1150° C. for several seconds (spike anneal). If the dopants in the ASG layer 34A and BSG layer 34B have different diffusion characteristics an additional preliminary anneal can be performed before the deposition of the second doped glass layer in FIG. 4 so that the nFET and pFET devices can receive different thermal budgets for optimized device performance. In this case, for example, the doped glass layer 32A can be applied first, followed by the preliminary anneal. The second doped glass layer 34B can then be applied, followed by the anneal of FIG. 5.

The extension regions 34A and 34B can extend through the entire thickness of the ETSOI layer 14, and can have a resulting dopant concentration in a range of about $10^{18}$ atoms/cm$^3$ to about $10^{21}$ atoms/cm$^3$. The extension regions 34A and 34B are closely interfaced to their respective S/Ds and extend at least partially under the thin spacer 26 and define a channel region between them beneath the gate stack 18.

Figure 6:
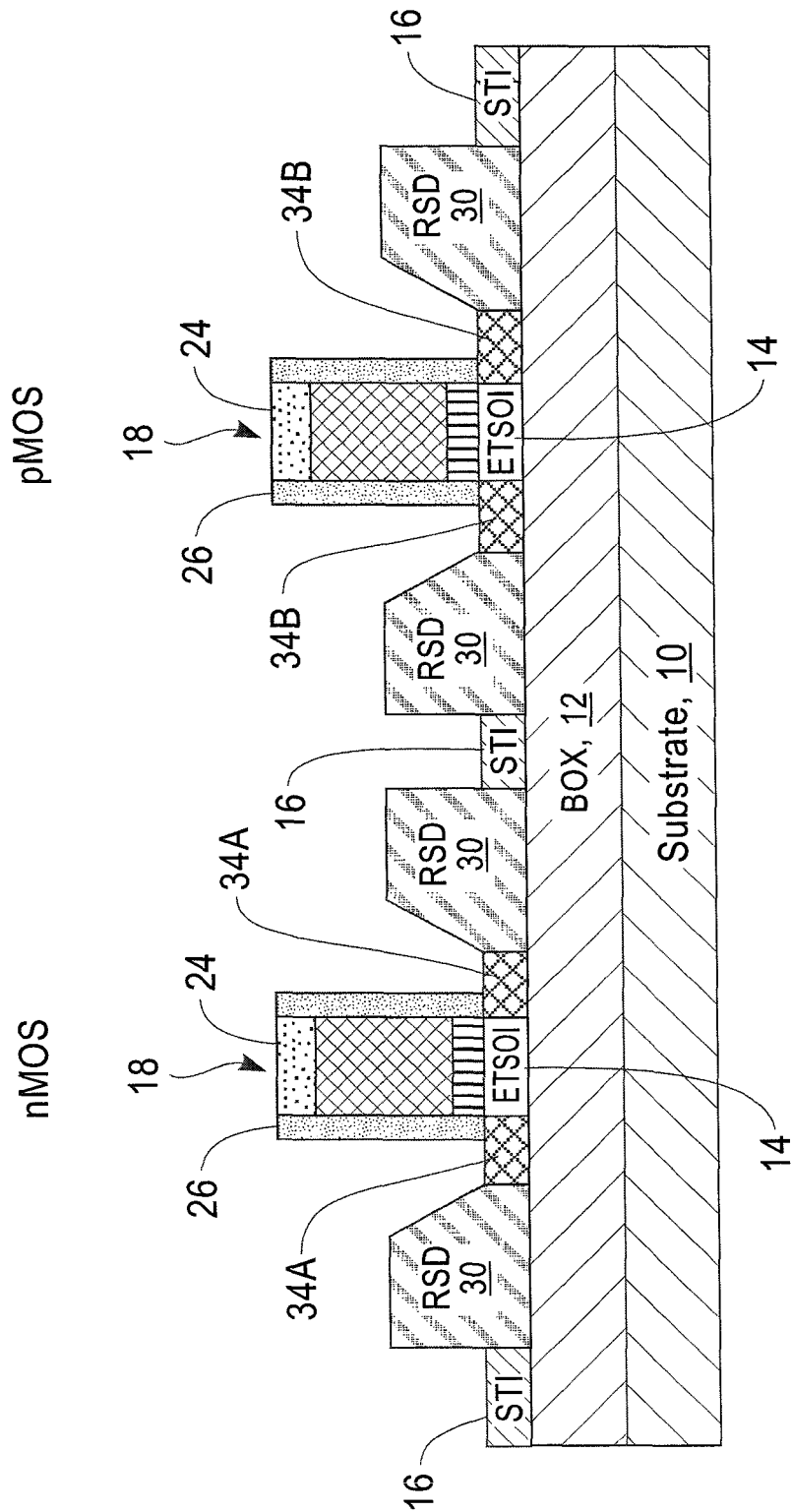

FIG. 6 shows the structure of FIG. 5 after a wet chemical etch to remove the doped glass layers 32A, 32B. The wet chemical etch can be based on (but is not limited to), for example, dilute Hydrofluoric acid (dHF) or buffered HF (BHF) chemistry. Processing then continues to perform conventional CMOS processing, such as by forming appropriate silicides and final spacer deposition over the gate stacks 18.

FIGS. 7-12 illustrate a gate-last (replacement gate) processing embodiment of this invention. Unless indicated otherwise the various materials including dopants, doped glasses, dimensions and layer thicknesses can be the same as in the embodiment described in FIGS. 1-6.

Figure 7:
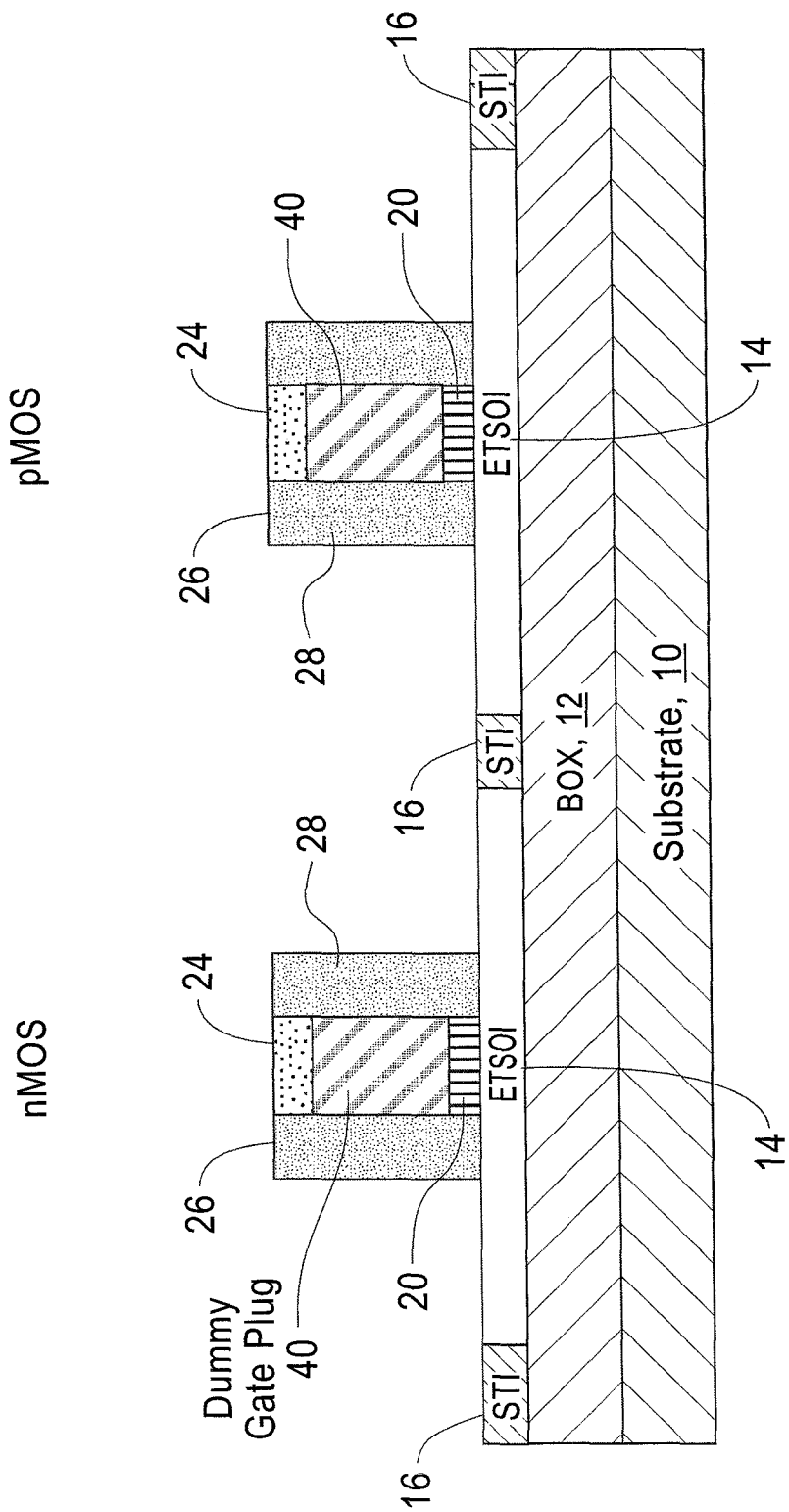
FIGS. 7-12 illustrate a gate-last processing embodiment of this invention, where

FIG. 7 is an enlarged cross-sectional view of a portion of the ETSOI starting structure as in FIG. 1 that includes the substrate 10, the overlying BOX layer 12 and the Si layer (ETSOI layer 14) overlying the BOX 12. FIG. 7 differs from FIG. 1 in that a gate structure at this point includes a dummy gate plug 40 (e.g., polysilicon) that overlies the thin gate dielectric layer 20, the hard mask 24 that overlies the dummy gate plug 40, the thin Oxide spacer layer 26, which in this embodiment can be a deposited either by PECVD or by PEALD, and the disposable spacer 28, which can be comprised of a nitride also deposited by the PECVD or PEALD process. In this embodiment the thin spacer layer 26 is removed during the processing step shown in FIG. 9.

Figure 8:
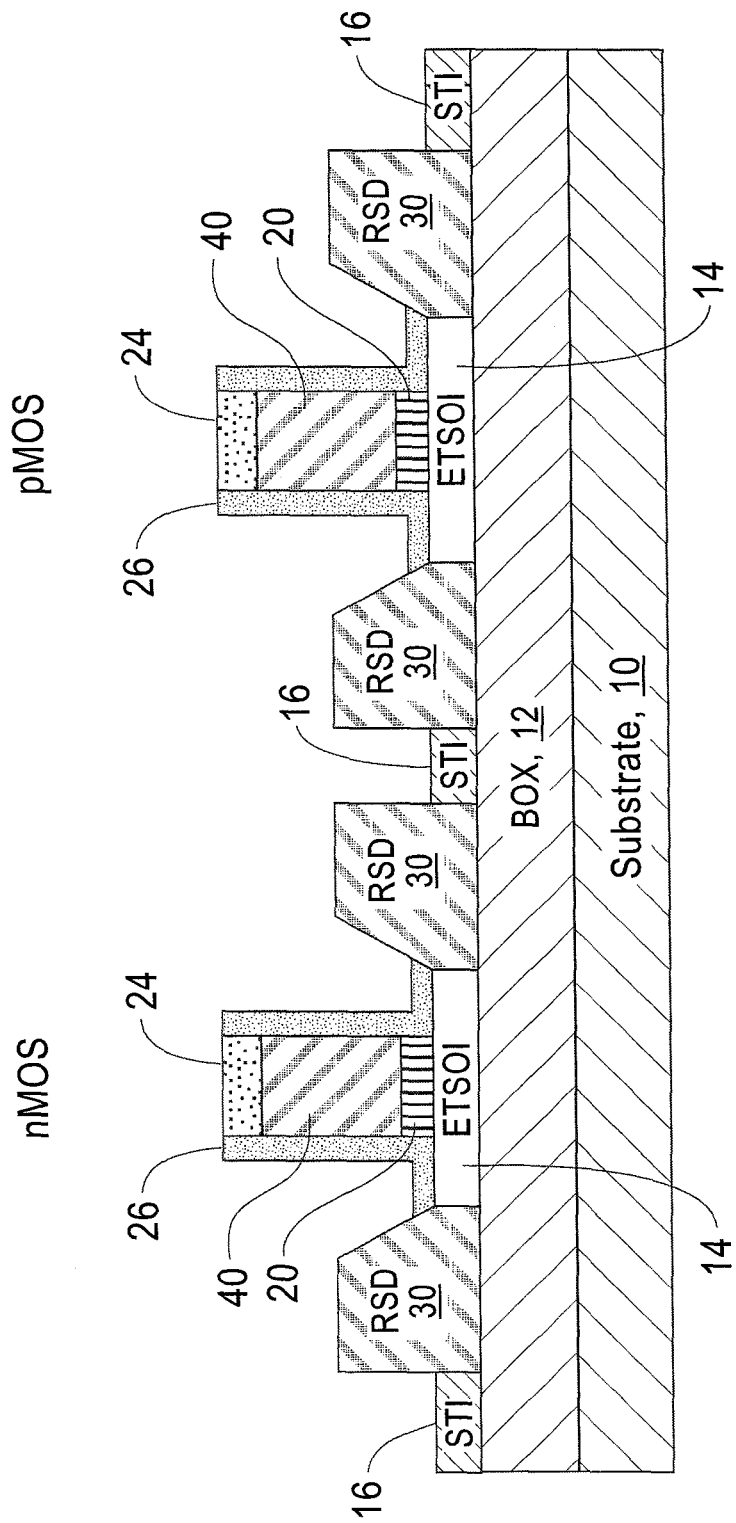

FIG. 8 shows the structure of FIG. 7 after growth of RSD structures 30 and the removal of the sacrificial spacer 28. As in the embodiment of FIG. 2, the RSD structures 30 can be formed by epitaxial growth, e.g., in situ Boron doped (ISBD) SiGe for pMOS and in situ Phosphorus doped (ISP) Si/SiC for nMOS or undoped Si/SiGe. FIG. 8 shows faceted epitaxy of SiGe or Si/SiGe or Si/C, selective to Si, with a sloping faceted sidewall of each of the RSD structures 30. A wet cleaning etch can be performed prior to growth of the RSD structures 30. If not in situ doped the RSD structures can be implanted. An anneal is performed to activate the S/D dopants. After the epi growth of the RSD structures 30 another etch, such as one based on hot phosphoric acid or an RIE process selective to nitride, is performed to remove the nitride spacer 28 resulting in the intermediate structure shown in FIG. 8.

Figure 9:
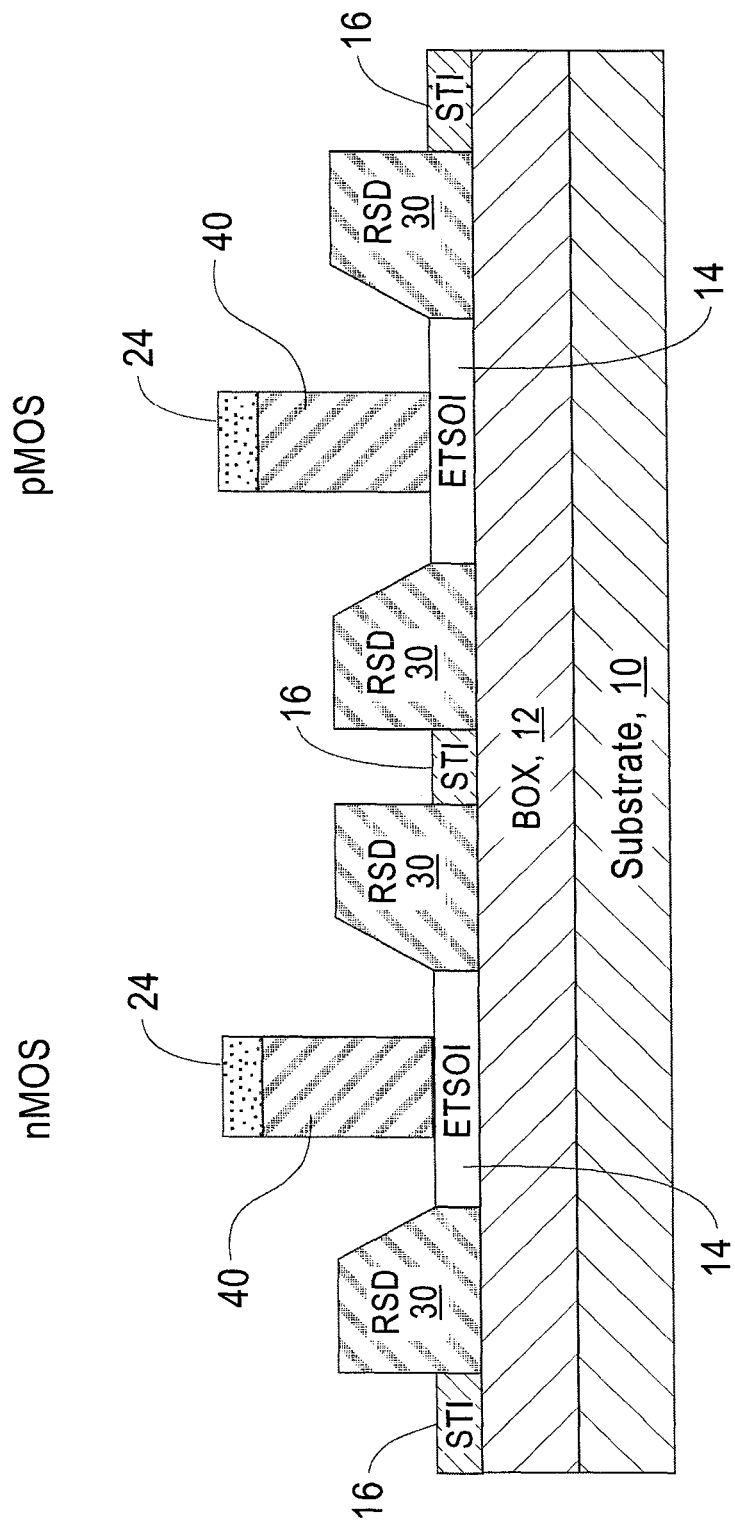

FIG. 9 shows the structure of FIG. 8 after removal of the thin oxide spacer 26. A wet etch process can be used to remove the spacer 26. Due to the presence of the dummy gate plug 40, which will be subsequently removed during the replacement gate process and replaced with a desired gate metal system, removal of the spacer 26 enables the subsequently diffused extension dopants to be properly aligned with the gate.

Figure 10:
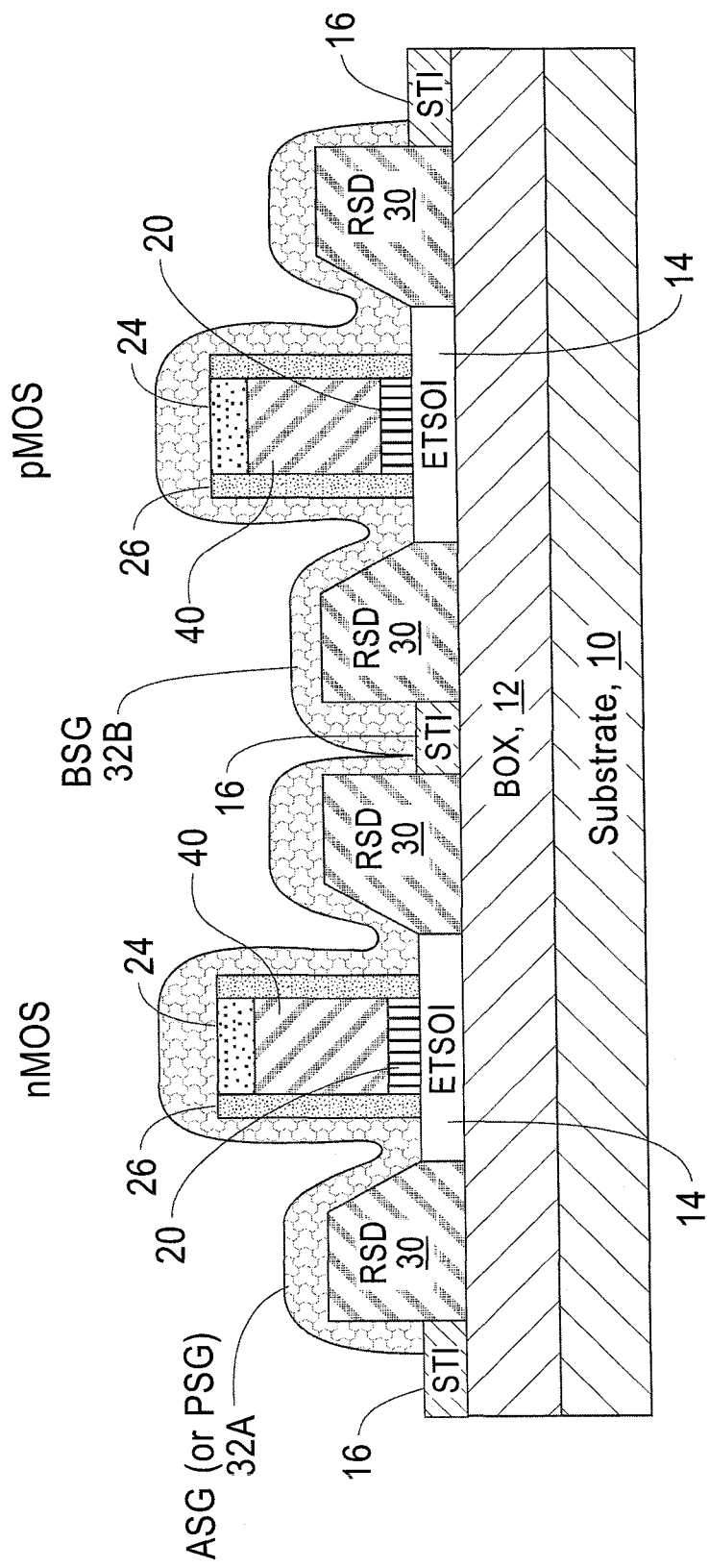

FIG. 10 shows the structure of FIG. 9 after doped glass layers are applied as was described above for the processing step shown in FIG. 4, i.e., for nMOS the doped glass layer can be a layer 32A of arsenic-doped silicate glass (ASG) or phosphorous-doped silicate glass (PSG), while for the pMOS the doped glass layer can be a layer 32B of boron-doped silicate glass (BSG).

Figure 11:
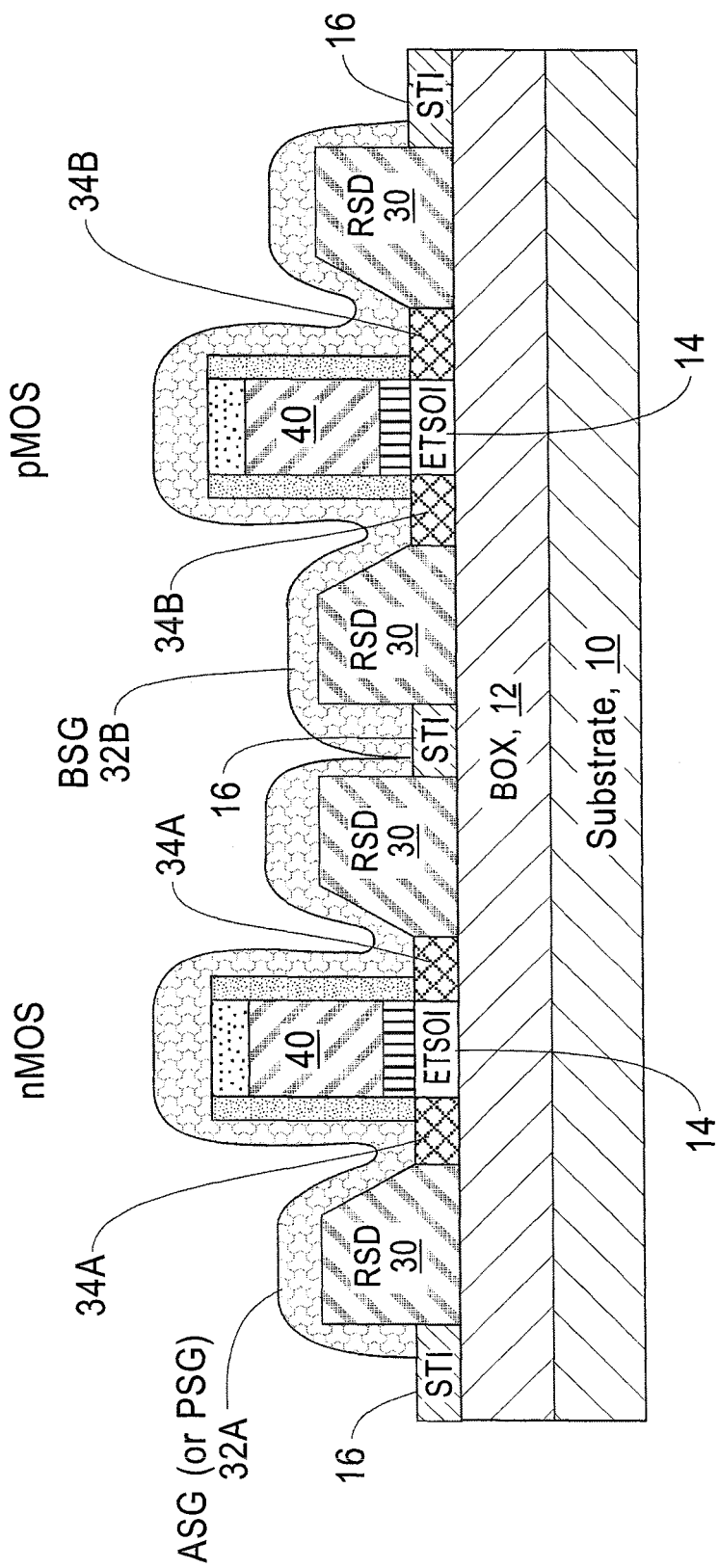

FIG. 11 shows the structure of FIG. 10 after an anneal is performed to drive dopants (e.g., Arsenic in ASG layer 32A and Boron in BSG layer 34B) into the ETSOI layer 14 to form Arsenic doped extensions 34A and Boron doped extensions 34B for nFET and pFET devices, respectively.

As in the embodiment of FIG. 5, the anneal process can be performed at a temperature in a range of about, for example, 1050° C. to about 1080° C. for several seconds (spike anneal). If the dopants in the ASG layer 34A and BSG layer 34B have different diffusion characteristics an additional preliminary anneal can be performed before the deposition of the second doped glass layer in FIG. 4 so that the nFET and pFET devices can receive different thermal budgets for optimized device performance. In this case, for example, the doped glass layer 32A can be applied first, followed by the preliminary anneal. The second doped glass layer 34B can then be applied, followed by the anneal of FIG. 5. The extension regions 34A and 34B can extend through the entire thickness of the ETSOI layer 14, and can have a resulting dopant concentration in a range of about $10^{18}$ atoms/cm$^3$ to about $10^{20}$ atoms/cm$^3$. The extension regions 34A and 34B are closely interfaced to their respective S/Ds and extend up to and possibly slightly beneath the edges of the dummy gate plugs 40 to define what will be a channel region between them beneath the subsequently formed gate stack.

Figure 12:
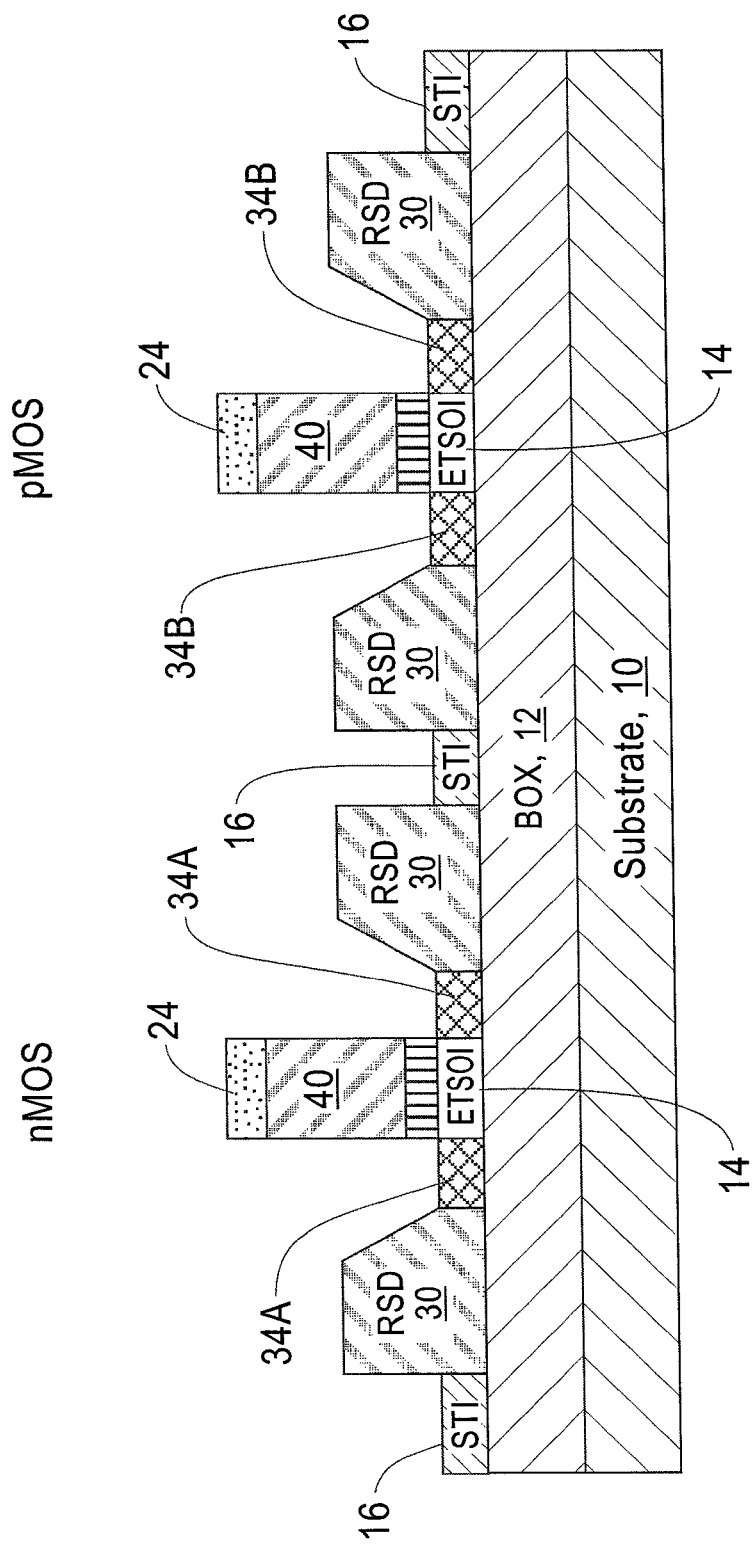

FIG. 12 shows the structure of FIG. 11 after a wet chemical etch to remove the doped glass layers 32A, 32B. The wet chemical etch can be based on, for example, dilute HF1 or buffered HF1 chemistry. Processing then continues to perform conventional CMOS processing, including replacing the dummy gate plug 40 with a desired gate metal conductor. In this case the subsequent processing can include depositing a dielectric layer, such as a spun-on layer of $SiO_2$, performing a chemical mechanical polish (CMP) process to planarize the structure expose the top of the hard mask 24, removing the hardmask 24 and the dummy gate plug 40, and depositing a desired gate dielectric material, such as one comprised of a high dielectric constant material, followed by depositing a desired gate conductor (e.g., a desired metal system) into the opening left where the dummy gate plug 40 is removed. After forming the desired gate stack other processes can be performed such as forming appropriate silicides and final spacer deposition over the resultantly formed gate stacks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The transistor devices formed by the use of the exemplary embodiments can be used for constructing integrated circuits with various analog and digital circuitry. In particular, integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those materials, metals, insulators, dopants, dopant concentrations, dopant-containing glasses, layer thicknesses and the like that were specifically disclosed above. Any and all such and similar modifications of the teachings of this invention will still fall within the scope of this invention.

What is claimed is:

1. A method to fabricate a transistor, comprising:
   providing a wafer comprising a substrate, an insulating layer disposed over the substrate and semiconductor layer disposed over the insulating layer; the wafer being provided with at least one gate structure comprising on sidewalls thereof a layer of dielectric material, a portion of the layer of dielectric material extending away from the gate structure and being disposed on a surface of the semiconductor layer;
   forming a raised source and a raised drain on the semiconductor layer adjacent to the portion of the layer of dielectric material;
   removing the portion of the layer of dielectric material to expose an underlying portion of the surface of the semiconductor layer between the gate structure and the raised source and the raised drain;

applying a layer of material comprised of a glass containing a dopant, the layer of material being applied so as to cover at least the exposed portion of the surface of the semiconductor layer; diffusing the dopant from the layer of material through the exposed portion of the surface of the semiconductor layer to form a source extension region and a drain extension region; and removing the layer of material.

2. The method of claim 1, where the layer of material is comprised of arsenic-doped silicate glass (ASG) or phosphorus doped silicate glass (PSG) when the transistor being fabricated is to be an n-type field effect transistor.

3. The method of claim 1, where the layer of material is comprised of boron-doped silicate glass (BSG) when the transistor being fabricated is to be a p-type field effect transistor.

4. The method of claim 1, where the semiconductor layer is an extremely thin silicon on insulator layer.

5. The method of claim 4, where forming the raised source and raised drain epitaxially grows an in-situ doped raised source and raised drain upon the extremely thin silicon on insulator layer.

6. The method of claim 4, where forming the raised source and raised drain epitaxially grows an undoped raised source and raised drain upon the extremely thin silicon on insulator layer, and further comprising implanting a dopant into the raised source and raised drain.

7. The method of claim 1, where the gate structure is comprised of a gate conductor, and where the dielectric layer is comprised of a silicon nitride spacer layer and an overlying silicon oxide layer.

8. The method of claim 1, where the gate structure is comprised of a dummy gate plug, and where the dielectric layer is comprised of an oxide layer and an overlying nitride layer.

9. The method of claim 1, where forming a raised source and raised drain results in forming a source facet and a drain facet that are upwardly sloping away from the gate structure.

10. A method to fabricate a plurality of transistors, comprising:

providing a wafer comprising a substrate, an insulating layer disposed over the substrate and semiconductor layer disposed over the insulating layer; the wafer being provided with at least a first gate structure and a second gate structure each comprising on sidewalls thereof a layer of dielectric material, a portion of the layer of dielectric material extending away from each gate structure and being disposed on a surface of the semiconductor layer;

forming a raised source and a raised drain on the semiconductor layer adjacent to the portion of the layer of dielectric material of each gate structure;

removing the portion of the layer of dielectric material to expose an underlying portion of the surface of the semiconductor layer between each gate structure and the raised source and the raised drain;

applying a first layer of glass containing a first type of dopant, the first layer of glass being applied so as to cover at least the exposed portion of the surface of the semiconductor layer adjacent to the first gate structure;

applying a second layer of glass containing a second type of dopant, the second layer of glass being applied so as to cover at least the exposed portion of the surface of the semiconductor layer adjacent to the second gate structure;

annealing the first layer of glass and the second layer of glass to diffuse the first dopant from the first layer of glass and second dopant from second layer of glass through the underlying exposed portions of the surface of the semiconductor layer to form adjacent to the first gate structure and the second gate structure a source extension region and a drain extension region; and removing the first and second layers of glass.

11. The method of claim 10, where the first dopant is an n-type dopant and where the second dopant is a p-type dopant.

12. The method of claim 10, where the first layer of glass is comprised of arsenic-doped silicate glass (ASG) or phosphorus-doped silicate glass (PSG), and where the second layer of glass is comprised of boron-doped silicate glass (BSG).

13. The method of claim 10, where the semiconductor layer is an extremely thin silicon on insulator layer.

14. The method of claim 13, where forming the raised source and raised drain epitaxially grows an in-situ doped raised source and raised drain upon the extremely thin silicon on insulator layer, where forming the raised source and raised drain results in forming a source facet and a drain facet that are upwardly sloping away from the gate structure.

15. The method of claim 13, where forming the raised source and raised drain epitaxially grows an undoped raised source and raised drain upon the extremely thin silicon on insulator layer, and further comprising implanting a dopant into the raised source and raised drain, where forming the raised source and raised drain results in forming a source facet and a drain facet that are upwardly sloping away from the gate structure.

16. The method of claim 10, where each gate structure is comprised of a gate conductor, and where the dielectric layer is comprised of a silicon nitride spacer layer and an overlying silicon oxide layer.

17. The method of claim 10, where each gate structure is comprised of a dummy gate plug, and where the dielectric layer is comprised of an oxide layer and an overlying nitride layer.

18. The method of claim 10, where applying the first layer of glass containing the first type of dopant comprises performing an initial anneal of the first layer of glass prior to the steps of applying the second layer of glass and annealing the first layer of glass and the second layer of glass.

\* \* \* \* \*